(12) United States Patent
Dougherty et al.

(10) Patent No.: US 7,061,246 B2
(45) Date of Patent: Jun. 13, 2006

(54) BATTERY MONITORING SYSTEM AND METHOD

(75) Inventors: Thomas J. Dougherty, Waukesha, WI (US); William J. Wruck, Whitefish Bay, WI (US); Ronald C. Miles, Whitefish Bay, WI (US); Deeyu C. Chen, Oak Creek, WI (US); Michael L. Thompson, East Troy, WI (US)

(73) Assignee: Johnson Controls Technology Company, Holland, MI (US)

( * ) Notice: Subject to any disclaimer, the term of this patent is extended or adjusted under 35 U.S.C. 154(b) by 341 days.

(21) Appl. No.: 10/781,567

(22) Filed: Feb. 18, 2004

(65) Prior Publication Data

US 2004/0189257 A1 Sep. 30, 2004

Related U.S. Application Data

(63) Continuation of application No. 10/313,983, filed on Dec. 6, 2002, now Pat. No. 6,727,708.
(60) Provisional application No. 60/337,183, filed on Dec. 6, 2001.

(51) Int. Cl.
*G01N 27/416* (2006.01)

(52) U.S. Cl. ....................................................... 324/426
(58) Field of Classification Search ......... 324/426–432; 702/63; 320/132
See application file for complete search history.

(56) References Cited

U.S. PATENT DOCUMENTS

| | | |
|---|---|---|
| 3,906,329 A | 9/1975 | Bader |
| 4,153,867 A | 5/1979 | Jungfer et al. |
| 4,193,025 A | 3/1980 | Frailing et al. |
| 4,207,611 A | 6/1980 | Gordon |
| 4,322,685 A | 3/1982 | Frailing et al. |
| 4,595,880 A | 6/1986 | Patil |
| 4,642,600 A | 2/1987 | Gummelt et al. |
| 4,659,977 A | 4/1987 | Kissel et al. |
| 4,665,370 A | 5/1987 | Holland |
| 4,719,427 A | 1/1988 | Morishita et al. |
| 4,816,736 A | 3/1989 | Dougherty et al. |
| 4,876,513 A | 10/1989 | Brilmyer et al. |
| 4,888,716 A | 12/1989 | Ueno |
| 4,937,528 A | 6/1990 | Palanisamy |
| 4,943,777 A | 7/1990 | Nakamura et al. |
| 4,952,861 A | 8/1990 | Horn |
| 5,002,840 A | 3/1991 | Klebenow et al. |
| 5,032,825 A | 7/1991 | Kuznicki |
| 5,055,656 A | 10/1991 | Farah et al. |
| 5,079,716 A | 1/1992 | Lenhardt et al. |
| 5,130,699 A | 7/1992 | Reher et al. |
| 5,159,272 A | 10/1992 | Rao et al. |

(Continued)

FOREIGN PATENT DOCUMENTS

DE    22 42 410    3/1973

(Continued)

OTHER PUBLICATIONS

How It Works: Reed Switch Motor, http://members.tripod.com/simplemotor/rsmotor.htm, available at least by Jan. 6, 2003, 4 pages.

(Continued)

*Primary Examiner*—Pia Tibbits
(74) *Attorney, Agent, or Firm*—Foley & Lardner LLP

(57) ABSTRACT

A method for predicting the remaining life of a battery for a vehicle includes obtaining a value representative of the amount of remaining life for a battery in a new and fully charged state and monitoring at least one parameter of the battery during use of the battery. The method also includes obtaining an acceleration factor based on the at least one monitored parameter and estimating the amount of life lost from the battery utilizing the acceleration factor.

38 Claims, 7 Drawing Sheets

U.S. PATENT DOCUMENTS

| | | |
|---|---|---|
| 5,162,164 A | 11/1992 | Dougherty et al. |
| 5,204,610 A | 4/1993 | Pierson et al. |
| 5,223,351 A | 6/1993 | Wruck |
| 5,280,231 A | 1/1994 | Kato et al. |
| 5,281,919 A | 1/1994 | Palanisamy |
| 5,316,868 A | 5/1994 | Dougherty et al. |
| 5,321,227 A | 6/1994 | Fuchs et al. |
| 5,349,535 A * | 9/1994 | Gupta .................. 702/63 |
| 5,352,968 A | 10/1994 | Reni et al. |
| 5,381,096 A | 1/1995 | Hirzel |
| 5,394,089 A * | 2/1995 | Clegg ................... 324/427 |
| 5,404,129 A | 4/1995 | Novak et al. |
| 5,412,323 A | 5/1995 | Kato et al. |
| 5,416,402 A | 5/1995 | Reher et al. |
| 5,428,560 A | 6/1995 | Leon et al. |
| 5,439,577 A | 8/1995 | Weres et al. |
| 5,488,283 A | 1/1996 | Dougherty et al. |
| 5,549,984 A | 8/1996 | Dougherty |
| 5,552,642 A | 9/1996 | Dougherty et al. |
| 5,563,496 A | 10/1996 | McClure |
| 5,572,136 A | 11/1996 | Champlin |
| 5,578,915 A | 11/1996 | Crouch, Jr. et al. |
| 5,656,915 A | 8/1997 | Eaves |
| 5,680,050 A | 10/1997 | Kawai et al. |
| 5,698,965 A | 12/1997 | York |
| 5,721,688 A | 2/1998 | Bramwell |
| 5,744,936 A | 4/1998 | Kawakami |
| 5,744,963 A | 4/1998 | Arai et al. |
| 5,761,072 A | 6/1998 | Bardsley, Jr. et al. |
| 5,773,977 A | 6/1998 | Dougherty |
| 5,808,367 A | 9/1998 | Akagi et al. |
| 5,808,445 A | 9/1998 | Aylor et al. |
| 5,818,116 A | 10/1998 | Nakae et al. |
| 5,818,333 A | 10/1998 | Yaffe et al. |
| 5,896,023 A | 4/1999 | Richter |
| 5,898,292 A | 4/1999 | Takemoto et al. |
| 5,936,383 A | 8/1999 | Ng et al. |
| 5,955,869 A * | 9/1999 | Rathmann ............ 320/132 |
| 5,965,954 A | 10/1999 | Johnson et al. |
| 5,977,654 A | 11/1999 | Johnson et al. |
| 5,990,660 A | 11/1999 | Meissner |
| 6,016,047 A | 1/2000 | Notten et al. |
| 6,037,749 A | 3/2000 | Parsonage |
| 6,037,777 A | 3/2000 | Champlin |
| 6,057,666 A | 5/2000 | Dougherty et al. |
| 6,087,808 A | 7/2000 | Pritchard |
| 6,091,325 A | 7/2000 | Zur et al. |
| 6,118,252 A | 9/2000 | Richter |
| 6,118,275 A | 9/2000 | Yoon et al. |
| 6,144,185 A | 11/2000 | Dougherty et al. |
| 6,160,382 A | 12/2000 | Yoon et al. |
| 6,222,341 B1 | 4/2001 | Dougherty et al. |
| 6,268,712 B1 | 7/2001 | Laig-Horstebrock et al. |
| 6,271,642 B1 | 8/2001 | Dougherty et al. |
| 6,296,593 B1 | 10/2001 | Gotou et al. |
| 6,300,763 B1 | 10/2001 | Kwok |
| 6,304,059 B1 | 10/2001 | Chalasani et al. |
| 6,331,762 B1 | 12/2001 | Bertness |
| 6,369,578 B1 | 4/2002 | Crouch, Jr. et al. |
| 6,388,421 B1 | 5/2002 | Abe |
| 6,388,450 B1 | 5/2002 | Richter et al. |
| 6,392,389 B1 | 5/2002 | Kohler |
| 6,392,414 B1 | 5/2002 | Bertness |
| 6,392,415 B1 | 5/2002 | Laig-Horstebrock et al. |
| 6,417,668 B1 | 7/2002 | Howard et al. |
| 6,424,157 B1 | 7/2002 | Gollomp et al. |
| 6,441,585 B1 | 8/2002 | Bertness |
| 6,445,158 B1 | 9/2002 | Bertness et al. |
| 6,452,361 B1 | 9/2002 | Dougherty et al. |
| 6,472,875 B1 | 10/2002 | Meyer |
| 6,495,990 B1 | 12/2002 | Champlin |
| 6,507,194 B1 | 1/2003 | Suzuki |
| 6,515,452 B1 | 2/2003 | Choo |
| 6,515,456 B1 | 2/2003 | Mixon |
| 6,522,148 B1 | 2/2003 | Ochiai et al. |
| 6,534,992 B1 | 3/2003 | Meissner et al. |
| 6,556,019 B1 | 4/2003 | Bertness |
| 6,600,237 B1 | 7/2003 | Meissner |
| 6,600,293 B1 | 7/2003 | Kikuchi |
| 6,608,482 B1 | 8/2003 | Sakai et al. |
| 6,653,818 B1 | 11/2003 | Laig-Horstebrock et al. |
| 2002/0008495 A1 | 1/2002 | Dougherty et al. |
| 2002/0026252 A1 | 2/2002 | Wruck et al. |
| 2002/0031700 A1 | 3/2002 | Wruck et al. |
| 2003/0047366 A1 | 3/2003 | Andrew et al. |
| 2003/0082440 A1 | 5/2003 | Mrotek et al. |
| 2003/0142228 A1 | 7/2003 | Flach et al. |
| 2003/0236656 A1 | 12/2003 | Dougherty |
| 2004/0021468 A1 | 2/2004 | Dougherty et al. |

FOREIGN PATENT DOCUMENTS

| | | |
|---|---|---|
| DE | 2 242 510 C3 | 4/1974 |
| DE | 25 11 426 A1 | 9/1975 |
| DE | 33 34 128 A1 | 4/1985 |
| DE | 37 12 629 C2 | 10/1987 |
| DE | 38 08 559 A1 | 9/1989 |
| DE | 39 01 680 A1 | 3/1990 |
| DE | 40 07 883 A1 | 9/1991 |
| DE | 38 82 374 T2 | 10/1993 |
| DE | 44 14 134 A1 | 11/1994 |
| DE | 43 39 568 | 5/1995 |
| DE | 689 24 169 T2 | 3/1996 |
| DE | 195 40 827 A1 | 5/1996 |
| DE | 195 43 874 | 5/1996 |
| DE | 197 50 309 A1 | 5/1999 |
| DE | 691 31 276 T2 | 12/1999 |
| DE | 198 47 648 A1 | 4/2000 |
| DE | 694 23 918 T2 | 8/2000 |
| DE | 199 60 761 C1 | 5/2001 |
| DE | 93 21 638 U1 | 8/2001 |
| DE | 100 21 161 A1 | 10/2001 |
| DE | 699 00 638 T2 | 8/2002 |
| EP | 0 516 336 B1 | 2/1992 |
| EP | 199 52 693 A1 | 5/2001 |
| EP | 1 116 958 A2 | 7/2001 |
| EP | 1 120 641 A2 | 8/2001 |
| WO | WO 97/15839 | 5/1997 |
| WO | WO 99 17128 | 4/1999 |
| WO | WO 99 66340 | 12/1999 |
| WO | WO 00/04620 | 1/2000 |
| WO | WO 01 15023 | 3/2001 |
| WO | WO 03/001224 A1 | 1/2003 |

OTHER PUBLICATIONS

Reed Relay Technical & Applications Information, COTO Technology, 55 Dupont Drive, Providence, RI, pgs. http://www.cotorelay.com/ReedTech.pdf, available at least by Jan. 6, 2003, 37–43.

Willibert Schleuter, *Das Elektrische Ersatzschaltbild des Bleiakkumulators unter Berücksichtigungerzwungener Elektrolytströmung*, etz Archiv, vol. 4 (1982), Issue 7, pp. 213–218.

Lürkens et al., *Ladezustandsschätzuntt von Bleibatterien mit Hilfe des Kalman–Filters*, etz Archiv, vol. 8 (1986), Issue 7, pp. 231–236.

Brooke, L., "Resin Keeps Batteries Cool", A1 Inside Magazine, Nov., 1998, p. 55.

Hoover, J., "Failure Modes of Batteries Removed from Service", a Presentation at the 107th Convention of Battery Council International, Apr. 30–May 3, 1995, p. 62.

Stan Gibilisco and Neil Sclater, Co–Editors–in–Chief, "Rectifier Bridge," Encyclopedia of Electronics, $2^{nd}$ Edition, TAB Professional and Reference Books, 1996, pp. 708–711.

Lehman, A., "Electrical Battery Model For Leo Application Based on Absolute Instantaneous State of Charge," Proceedings of the European Space Power Conference held in Madrid, Spain, Oct. 2–6, 1989, ESA Publications, NL, vol. 1, pp. 173–178.

Robbins, Tim & Hawkins, John, "Battery Model For Over-Current Protection Simulation of DC Distribution Systems," Telecommunications Energy Conference, 1994, Intelec '94, $16^{th}$ International Vancouver, BC, Canada Oct. 30–Nov. 3, 1994, New York, NY, IEEE, pp. 307–314 XP001036407 ISBN: 0–7803–2034–4.

Mayer, D. et al., "Modelling and Analysis of Lead Acid Battery Operation," Ecole des Mines de Paris, XP010092137, pp. 1–3.

Mauracher, P. & Karden, E., "Dynamic Modelling of Lead/Acid Batteries Using Impedance Spectroscopy for Parameter Identification," Journal of Power Sources, Elsevier Sequoia S.A., Lausanne, Ch., vol. 67 (1997) No. 1–2, pp. 69–84, XP004095174 ISSN: 0378–7753, p. 70, line 11; p. 82, Line 5, figures 2, 3, 12.

Baert, D & Vervaet, A., "Lead–Acid Battery Model for the Derivation of Peukert's Law," Electrochimica Acta, Elsevier Science Publishers, Barking, GB, vol. 44, No. 20, pp. 3491–3504 XP004168624 ISSN: 0013–4686.

International Search Report for PCT/US02/19760 (International filing date Jun. 21, 2002), date of mailing Oct. 10, 2002.

Conference Proceedings, Intelec '86—International Telecommunications Energy Conference, Determining the end of Battery Life—Sheldon DeBardelaben, New York Telephone Company, bearing a designation "Oct. 19–22, 1986." (6 sheets).

Bosch and the New E–Class, Electronic Battery Management System, Focus on Electronics, Nov. 2002 (1 sheet).

Forecast Review, The Battery Man, Nov., 1996 p. 21.

OnGuard™ XT Battery State–of–Health Monitor, 2003 Midtronics, Inc. P/N 156–983A (2 sheets).

Intelec '88—Tenth International communications Energy Conference, "A look at the Impedance of a Cell—S.L. DeBardelaben, New York Telephone Company," bearing a designation "Oct. 30–Nov. 2, 1988." (6 sheets).

Battery Alert, Ltd., "The Easy–to–Install Battery Deterioration Warning Device", 12 Volt Model (BA101) Advertisement (2 sheets).

Journal of Applied Electrochemistry, vol. 10 No. 1, Jan. 1980—The Impedance of Electrical Storage Cells—N.A. Hampson, s.A.G.R. Karunathilaka, Department of Chemistry, R. Leek, Department of Electronic and Electrical Engineering, University of Technology, Loughborough, Lieces-tershire, UK (11 sheets).

Battery Evaluation Reports. s.e. Ross Laboratories, Inc., Apr. 1999 (1 page).

HSR–003 Applictaion Notes, Hermetic Switch, Inc., Highway 92, Post Office Box 2220, Chickasha, OK 73023, http://www.hermeticswitch.com/RS.htm, available at least by Jan. 7, 2003 (1 page).

* cited by examiner

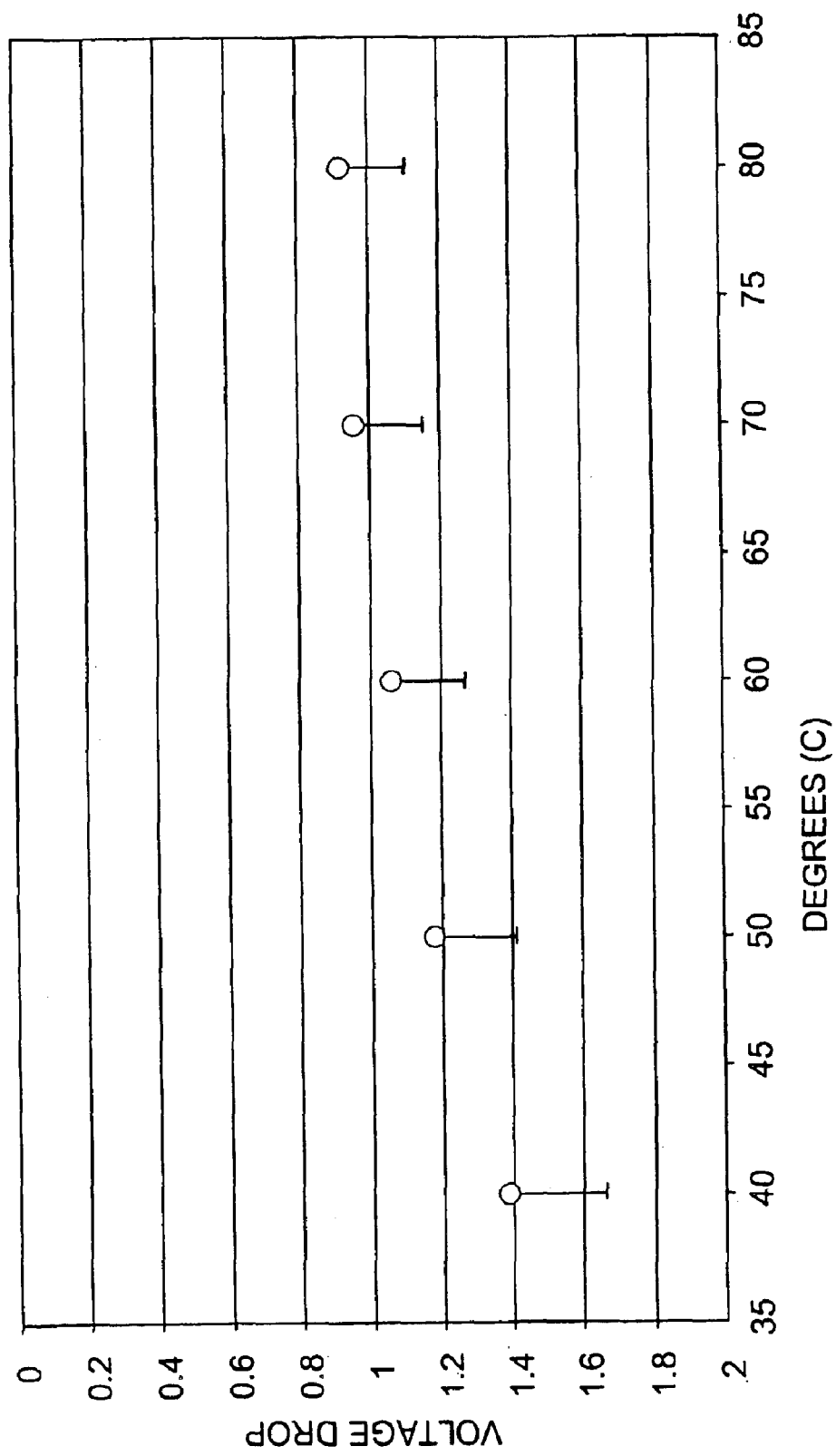

BATTERY MONITORING SYSTEM AND METHOD

CROSS-REFERENCE TO RELATED APPLICATIONS

This application is a continuation under 35 U.S.C. § 120 of U.S. patent application Ser. No. 10/313,983 titled "Battery Monitoring System" filed on Dec. 6, 2002, now U.S. Pat. No. 6,727,708 which claims the benefit of priority as available under 35 U.S.C. § 119(e) to U.S. Provisional Patent Application No. 60/337,183 titled "Battery Monitoring System and Method" filed Dec. 6, 2001.

The disclosures of the following patent applications are hereby incorporated by reference in their entirety: U.S. patent application Ser. No. 10/313,983 titled "Battery Monitoring System" filed on Dec. 6, 2002 and U.S. Provisional Patent Application No. 60/337,183 titled "Battery Monitoring System and Method" filed Dec. 6, 2001.

FIELD

The present invention relates to a battery monitoring system and method. The present invention more specifically relates to a system and method for predicting whether the battery will perform in certain applications as expected in the future.

BACKGROUND

It is generally known to provide for a system for determining when to replace a battery of a vehicle. According to such known systems, a determination is made to replace the battery at a pre-selected time such as five years after installation of the battery. According to such known systems, a determination is also made to replace the battery when the perceived time required for the battery to crank the engine (cranking time) is longer than expected. However, such known systems have several disadvantages including that the battery may require replacement before such pre-selected time, and any perceived increase in the cranking time may be due to other factors unrelated to the battery (such as a faulty starter).

It is also generally known to provide for a system for determining when to replace a battery of a vehicle based on the voltage of the battery. According to such known systems, a determination is made to replace the battery when the voltage of the battery falls below a pre-selected value. However, such known systems have several disadvantages, including that they do not record the "history" of the battery during its use as would allow for a more accurate prediction of the capacity of the battery, notwithstanding the measured voltage.

Accordingly, it would be advantageous to provide a battery monitoring system for predicting whether the battery will perform in certain applications as expected in the future. It would also be advantageous to provide a system for determining when a battery for a vehicle should be replaced which accounts for the history of the battery during its use. It would be desirable to provide for a battery monitoring system having one or more of these or other advantageous features.

SUMMARY OF THE INVENTION

The present invention relates to a method for predicting the remaining life of a battery for a vehicle. The method includes obtaining a value representative of the amount of remaining life for a battery in a new and fully charged state and monitoring at least one parameter of the battery during use of the battery. The method also includes obtaining an acceleration factor based on the at least one monitored parameter and estimating the amount of life lost from the battery utilizing the acceleration factor.

The present invention also relates to a method for monitoring a battery. The method includes obtaining an estimate of the time that a new battery will deliver a sufficient amount of power for a vehicle application and monitoring the battery during use. The method also includes determining the amount of time that the battery has been in a first state during the use, obtaining an acceleration factor for the first state, and adjusting the amount of time that the battery has been in the first state utilizing the acceleration factor. The method further includes subtracting the adjusted amount of time from the estimate to obtain an estimate of the remaining time that the battery will deliver a sufficient amount of power for a vehicle application.

The present invention also relates to a method for monitoring a battery for a vehicle. The method includes obtaining an input signal representative of an estimate of the amount of life remaining for a new battery and obtaining input signals during use of the battery that are representative of states of the battery. The method also includes determining the amount of time the battery is at a first state and determining the amount of time the battery is at a second state. The method further includes obtaining a first acceleration factor for the first state and a second acceleration factor for the second state. The method further includes applying the first acceleration factor to the amount of time the battery is at the first state to provide a first adjusted amount of time and applying the second acceleration factor to the amount of time the battery is at the second state to provide a second adjusted amount of time. The method further includes subtracting the first adjusted amount of time and the second adjusted amount of time from the estimate to provide an adjusted estimate of the remaining life of the battery.

DESCRIPTION OF THE FIGURES

FIG. 7 is a graph of the voltage drop of a battery during the starting of an engine of a vehicle versus temperature according to an exemplary embodiment.

DETAILED DESCRIPTION OF PREFERRED AND EXEMPLARY EMBODIMENTS

Figure 1:
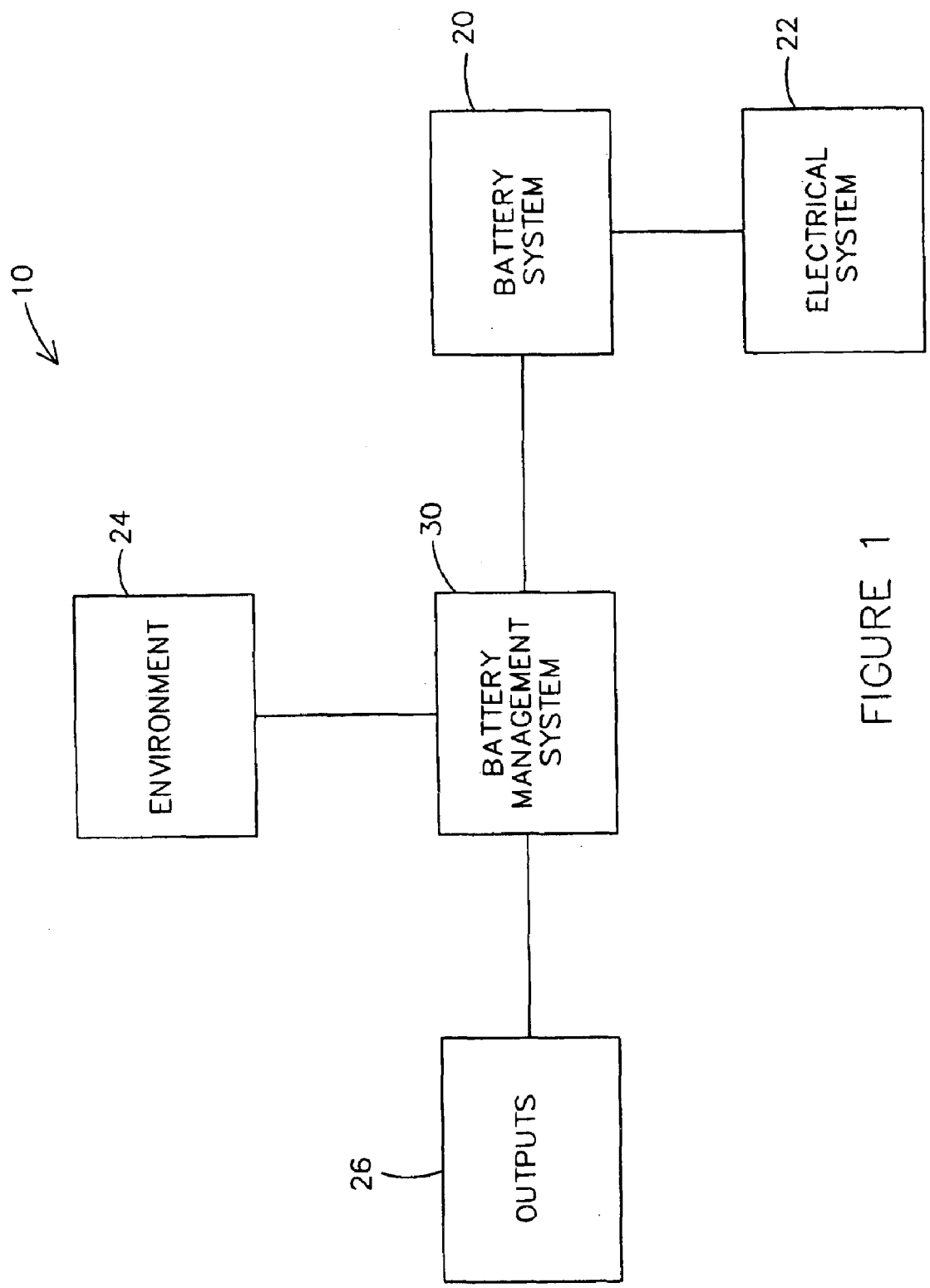
FIG. 1 is a schematic block diagram of a battery monitoring system according to an exemplary embodiment.

A battery monitoring system 10 as shown in FIG. 1 measures and records a set of parameters of a battery system 20 periodically during use over time. The parameters such as the voltage, temperature, state of charge and cycling of the battery may be acquired by a battery management system 30 from battery system 20, a vehicle electrical system 22, and an environment 24 according to a preferred embodiment, or may be otherwise acquired according to alternative embodiments.

System 10 predicts the ability of battery system 20 to perform in certain applications as expected in the future. Specifically, system 10 predicts whether battery system 20 has a sufficient remaining amount of "life" (i.e. may deliver a sufficient amount of power to the vehicle for a sufficient amount of time). In other words, system 10 predicts whether battery system 20 will likely be able to start the engine of the vehicle and power the loads of the vehicle.

A new, fully charged battery of battery system 10 has a fixed amount of "life." A certain amount of life is "lost" from battery system 20 during its use. For example, the cold cranking capability, reserve capacity and cycling capability of battery system 20 is reduced during its use of battery system 20. The extent to which the amount of life is lost from the battery depends on a variety of parameters, including the voltage, temperature, resistance, and state of charge of the battery system. An output signal 26 (such as a warning signal) that battery system 20 should be replaced is provided when system 10 predicts that battery system 20 will not likely perform for the intended use. (According to an alternative embodiment, another output signal comprises a signal to close a switch 40 (or switches) to connect the loads of an electrical system 22 to battery system 20 to "manage" operation of the battery system 20.)

One way system 10 predicts the amount of life remaining in battery system 20 is based on the monitored history or use of battery system 20. In general, the battery monitoring system sets a parameter intended to be representative of a battery "life." As the battery is in use over time, the battery monitoring system then subtracts a certain amount from the "life" based on the nature of the use. For example, a greater amount of life is subtracted if the battery undergoes a high voltage or temperature. The system also subtracts a greater amount of life if the battery is discharged to a great extent before it is recharged. Other uses may affect the extent to which the "life" is reduced.

Another way system 10 predicts the amount of life remaining in battery system 20 is based on a parameter monitored during cranking of the engine. In general, the battery monitoring system subtracts a greater amount of life if the battery takes a greater time to deliver a sufficient amount of power to crank the engine, or if the voltage of the battery drops dramatically during cranking of the engine.

Figure 2:
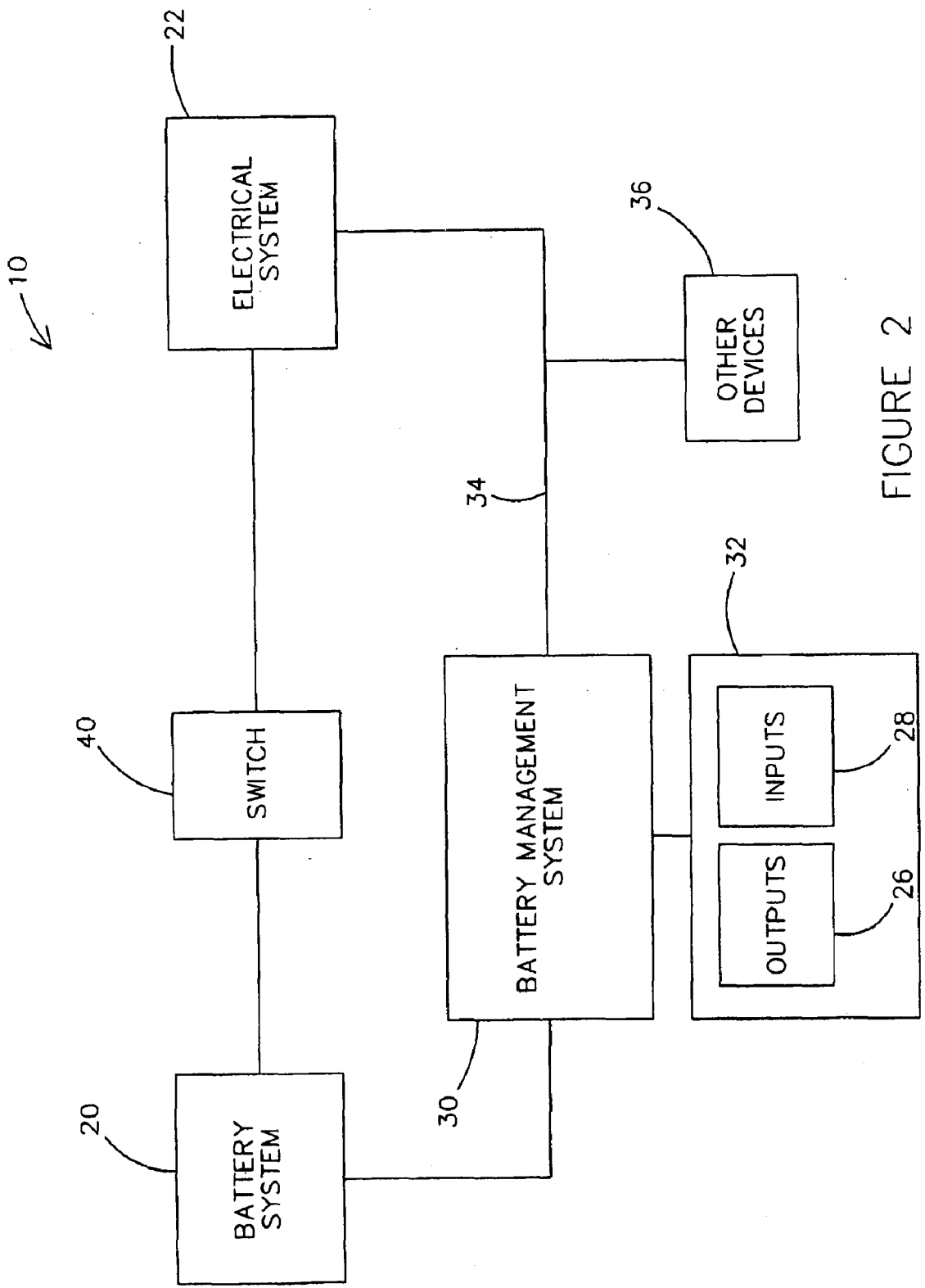
FIG. 2 is a schematic block diagram the battery monitoring system according to an alternative embodiment.

FIG. 2 shows system 10 according to an alternative embodiment. An input signal 28 representative of a condition or state of battery system 20 is provided to battery management system 30 by a sensor according to a preferred embodiment. Input signal 28 may also be provided to battery management system 30 by other devices 36 (such as a controller of a computing device for the vehicle as shown in FIG. 2) according to an alternative embodiment. Input signal 28 may also be provided to battery management system 30 by a network (shown as a CAN bus 34 in FIG. 2) according to another alternative embodiment. Input signal 28 may also be provided to battery management system 30 by a user interface 32 as shown in FIG. 2 according to a preferred embodiment.

Figure 3:
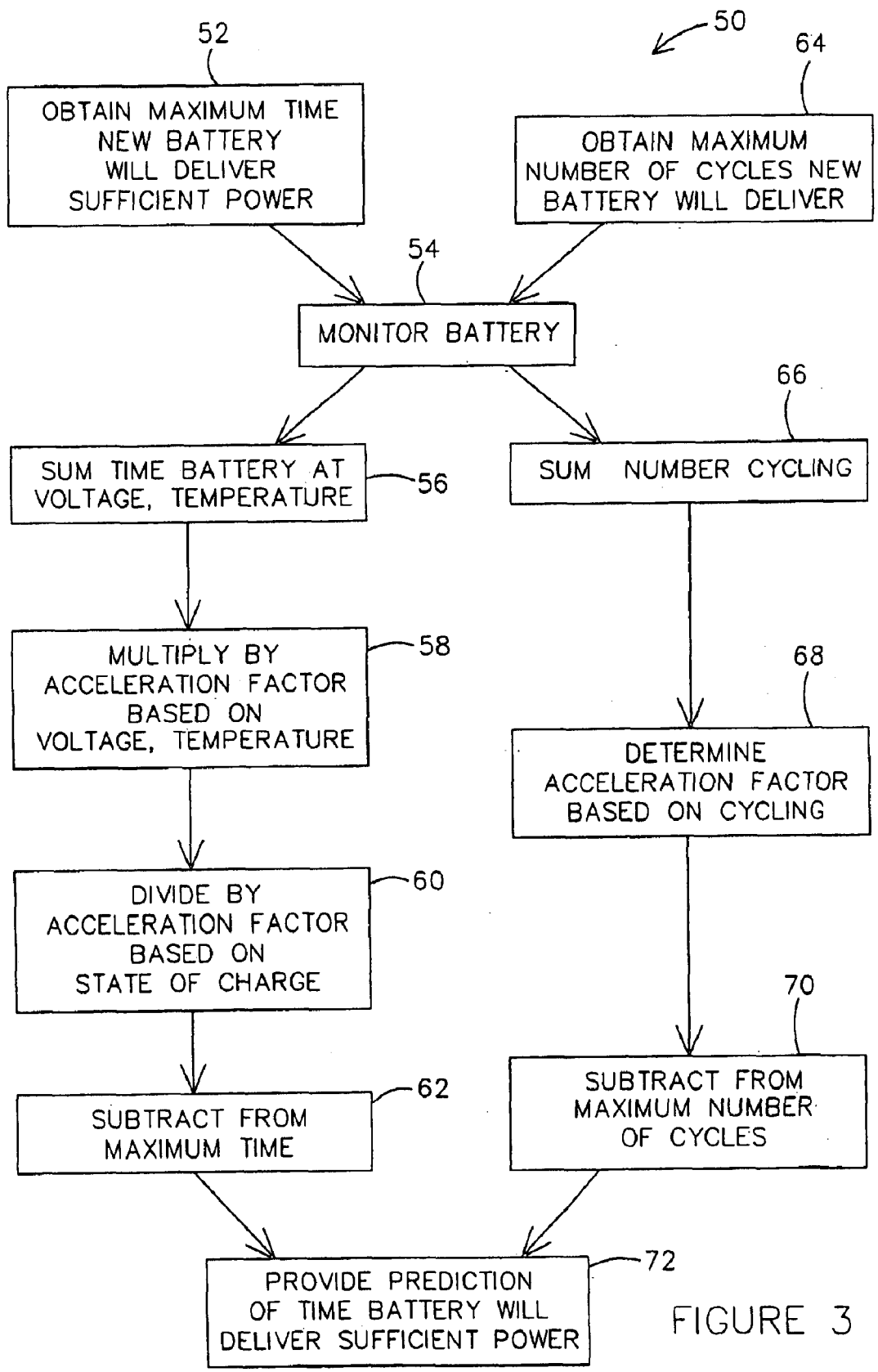
FIG. 3 is a flow diagram of a routine for predicting whether a battery may deliver a sufficient amount of power for a sufficient amount of time according to an exemplary embodiment.
Figure 4:
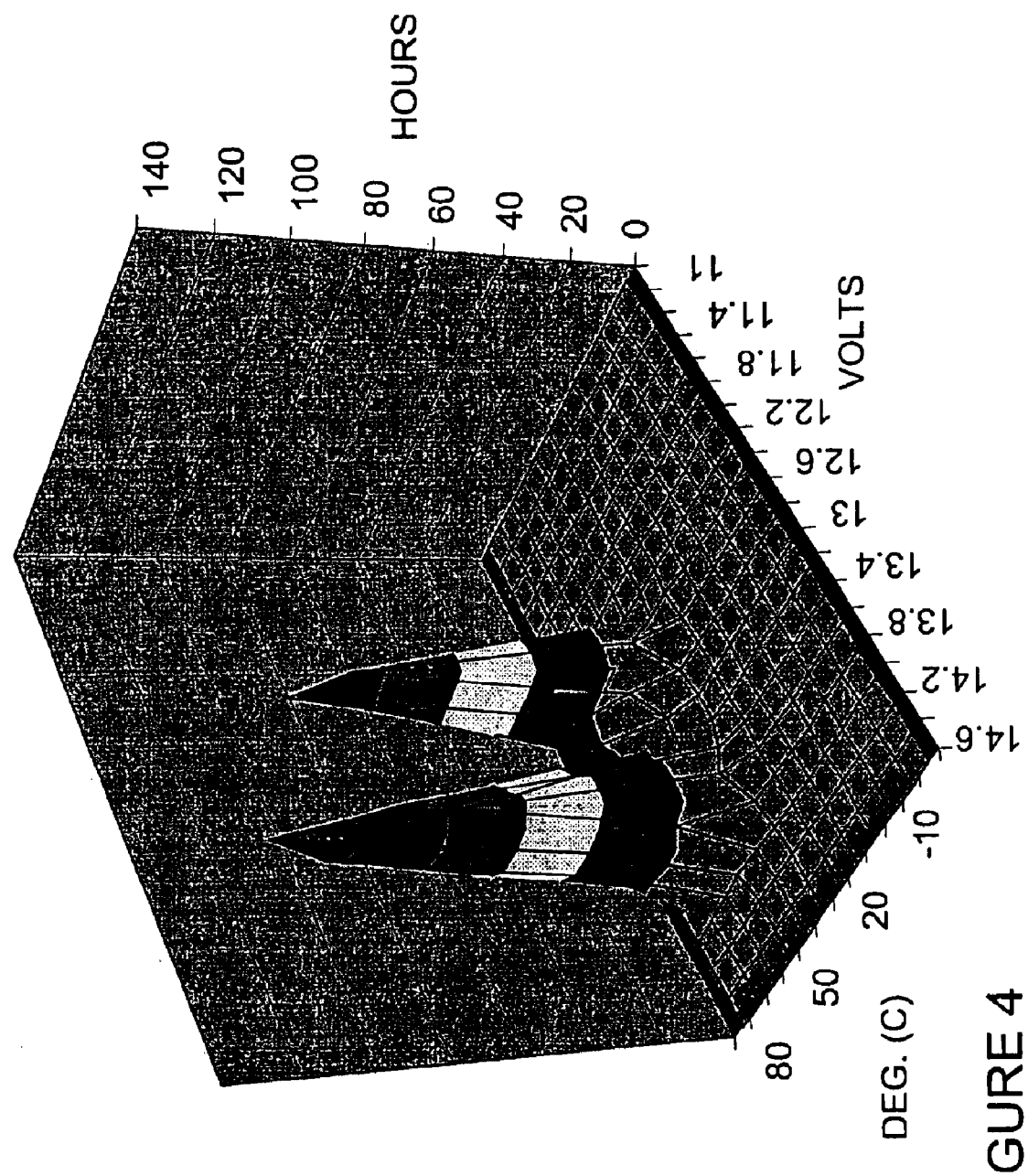
FIG. 4 is a graph showing the history of a battery according to an exemplary embodiment.

A routine 50 for predicting whether a battery of a battery system may deliver a sufficient amount of power for a sufficient amount of time is shown in FIG. 3. Routine 50 uses an input signal from a sensor (or otherwise acquired) representative of the voltage and temperature of the battery during use according to a preferred embodiment. The voltage and temperature of a battery is monitored and recorded over time according to a particularly preferred embodiment. The history of the voltage and temperature of a battery during use is shown in FIG. 4 according to an exemplary embodiment. As shown in FIG. 4 the battery is at about 50 degrees and about 13.5 volts for about 100 hours of use, and is at about 35 degrees and about 12.6 volts for about 5 hours of use.

Referring to FIG. 3, the amount of time a new, fully charged battery will deliver a sufficient amount of power for a sufficient amount of time is obtained as an input signal representative of the amount of "life" of the battery (step 52). This input signal is a pre-selected value such as 3300 days according to a preferred embodiment. Other input signals relating to parameters of the battery are also obtained from monitoring the battery (step 54). These input signals may relate to the voltage, temperature, time, cycling, state of charge, etc. of the battery according to alternative embodiments. The time the battery is at the specified voltage and temperature is summed (step 56).

The amount of life lost from the battery is determined based on the monitored parameters. If the battery undergoes at a high voltage or temperature during use, the amount of life lost from the battery is accelerated. An acceleration factor based on the voltage and temperature of the battery is pre-determined according to a preferred embodiment. The time the battery is at the voltage and temperature is multiplied by the acceleration factor based on voltage and temperature (step 58), resulting in a prediction of the amount of life lost of the battery due to voltage and temperature.

The amount of life lost from the battery is also determined based on the state of charge of the battery. If the battery undergoes a low state of charge, the amount of life lost from the battery is accelerated. An acceleration factor for each state of charge of the battery is pre-determined according to a preferred embodiment. The time the battery is at the state of charge is divided by the acceleration factor based on the state of charge (step 60), resulting in a prediction of the amount of life lost of the battery due to state of charge.

The time the battery is at the specified voltage and temperature (adjusted by the acceleration factors) is subtracted from the initial estimate of time the new, fully charged battery will deliver a sufficient amount of power for a sufficient amount of time (step 62). The result is a prediction of the amount of time (e.g. days) the battery may deliver a sufficient amount of power is then made (step 72).

Referring further to FIG. 3, the number of cycles a new, fully charged battery will deliver a sufficient amount of power is obtained as an input signal representative of the amount of "life" of the battery (step 66). A "cycle" is one discharge from 100 percent state of charge to complete discharge, plus one recharge to 100 percent state of charge. This input signal is a pre-selected value such as 1000 cycle counts according to a preferred embodiment. Other input signals relating to parameters of the battery are also obtained from monitoring the battery (step 54). The number of cycles of the battery is summed (step 66). If the battery undergoes a great discharge before it is recharged, the amount of life lost from the battery is accelerated. An acceleration factor based on the extent of cycling of the battery is pre-determined according to a preferred embodiment. The number of cycles of the battery is adjusted by the acceleration factor based on cycling (step 68). The number of cycles of the battery (adjusted by the acceleration factor) is subtracted from the initial estimate of the number of cycles of the new, fully charged battery (step 70) such as 1000 cycles or "counts." The result is a prediction of the number of cycle counts (or time) for which the battery may deliver a sufficient amount of power (step 72).

The steps for predicting whether a battery may deliver a sufficient amount of power for a sufficient amount of time is shown in TABLES 1–4 according to an exemplary embodiment. The time the battery is at a specified voltage, temperature and state of charge is continuously monitored during use of the battery in a vehicle according to a preferred embodiment. Over a 3.5 hour period, the battery is at the parameters shown in TABLE 1:

TABLE 1

| Temperature (degrees C.) | Voltage (V) | Percent State of Charge (SOC %) | Time (hours) |
|---|---|---|---|
| 50 | 14 | 90% | 2 |
| 40 | 13 | 50% | 1 |
| 30 | 12 | 10% | 0.5 |
|  |  |  | Sum = 3.5 hours |

The acceleration factor based on the voltage and temperature of the battery is determined (e.g. pre-determined from a lookup table stored in memory of the battery management system) according to a preferred embodiment as shown in TABLE 2:

TABLE 2

|  | 12 V | 13 V | 14 V |
|---|---|---|---|
| 50° C. | 7 | 9 | 10 |
| 40° C. | 4 | 5 | 8 |
| 30° C. | 1 | 2 | 6 |

The acceleration factor based on the state of charge of the battery is also determined (e.g. from a lookup table) according to a preferred embodiment as shown in TABLE 3:

TABLE 3

| State of Charge (%) | Acceleration Factor |
|---|---|
| 90% | 0.9 |
| 50% | 0.5 |
| 10% | 0.1 |

The amount of life or time lost from the battery during use is obtained by multiplying the time the battery was at the voltage and temperature (from TABLE 1) by the acceleration factor based factor voltage and temperature (from TABLE 2) and dividing by the acceleration factor based on the state of charge of the battery (from TABLE 3) as shown in TABLE 4:

TABLE 4

| Time (hours) | Acceleration Factor Based on Voltage and Temperature | Acceleration Factor Based on State of Charge | Time Lost (hours) |
|---|---|---|---|
| 2 | 10 | 0.9 | 22.2 |
| 1 | 5 | 0.5 | 10 |
| 0.5 | 1 | 0.1 | 5 |
| Sum = 3.5 hours |  |  | Sum = 37.2 hours |

The time the battery is at the specified voltage and temperature (adjusted by the acceleration factors) is subtracted from the initial estimate of time the new, fully charged battery will deliver a sufficient amount of power for a sufficient amount of time. Note the battery with parameters listed in TABLE 4 is used for 3.5 hours, but 37.2 hours are predicted to be lost from the battery (due to the acceleration factors).

The steps for predicting whether a battery may deliver a sufficient amount of power for a sufficient amount of time is shown in TABLES 5–7 according to an alternative embodiment. The cycling of the battery during discharge is continuously monitored during use of the battery in a vehicle according to a preferred embodiment. The battery is cycled the following amounts as shown in TABLE 5:

TABLE 5

| Period | Percentage of One Cycle |
|---|---|
| 1 | 61% |
| 2 | 50% |
| 3 | 10% |

The acceleration factor based on the cycling of the battery is determined (e.g. from a lookup table) according to a preferred embodiment) as shown in TABLE 6:

TABLE 6

| Percentage of One Cycle | Acceleration Factor Based on Cycling |
|---|---|
| 10% | 0.2 |
| 20% | 0.5 |
| 40% | 4 |
| 60% | 10 |

The amount of cycling (from TABLE 5) is adjusted by the acceleration factor based on cycling (from TABLE 6) for each period of use of the battery as shown in TABLE 7:

TABLE 7

| Period | Amount of Cycle (%) | Adjusted Cycle Counts |
|---|---|---|
| 1 | 61% | 10 |
| 2 | 50% | 4 |
| 3 | 10% | 0.2 |
|  |  | Sum =14.2counts |

The sum of the adjusted cycling counts is subtracted from the initial estimate of the number of cycling counts of the new, fully charged battery.

Figure 5:
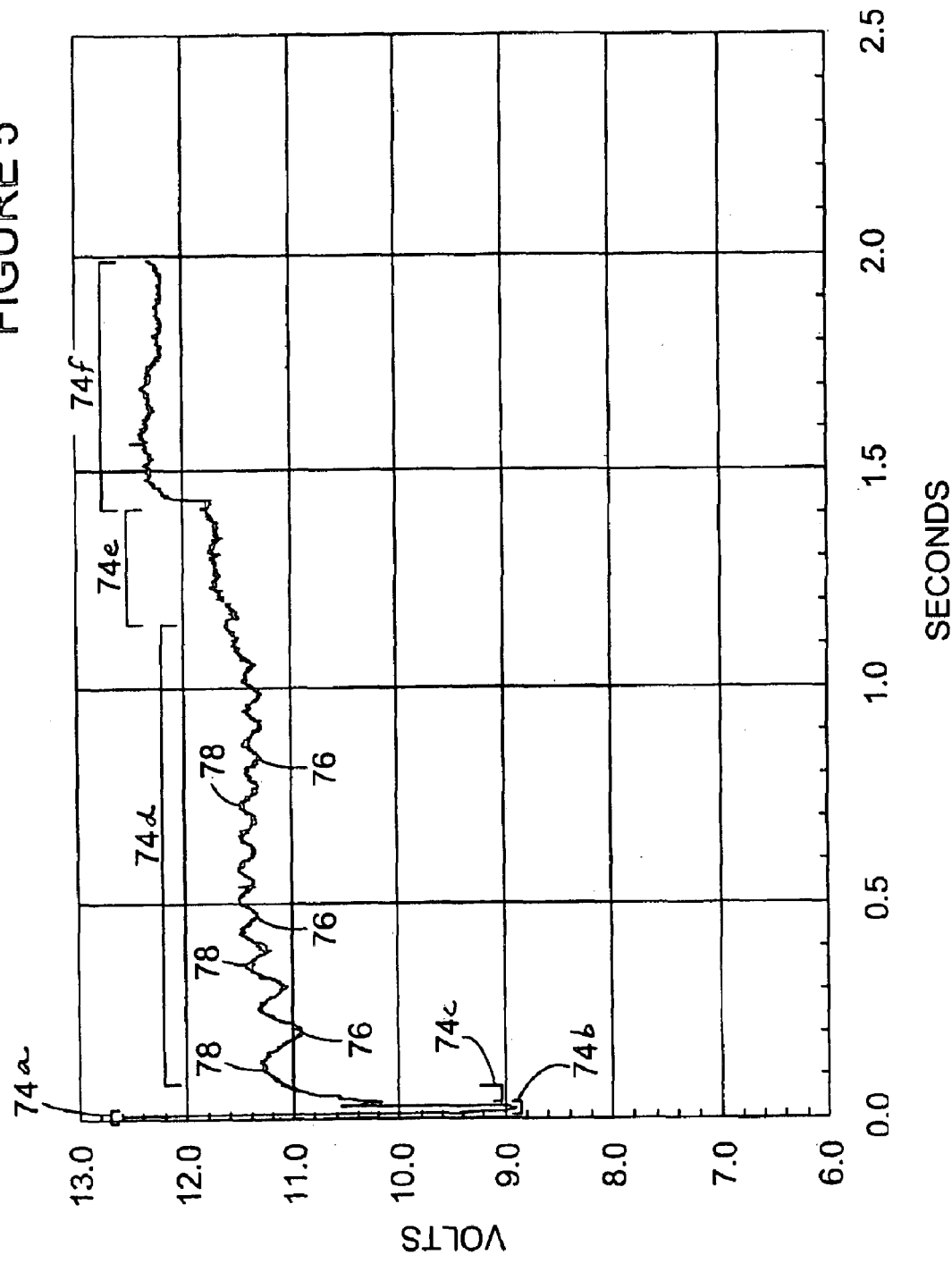
FIG. 5 is a graph of voltage versus time of a battery during the starting of an engine of a vehicle according to an exemplary embodiment.

Referring to FIG. 5, the voltage of a battery (at 100 percent state of charge and room temperature) during various times of use in a vehicle is shown according to an exemplary embodiment. The times comprise: a period 74*a* during which the voltage of the battery is not delivering or receiving power and all loads (including the starter) are disconnected from the battery—commonly referred to as "open circuit voltage"; a relatively short, subsequent period 74$b$ during which the voltage of the battery initially drops (due to connection of the starter to the battery); a subsequent period 74$c$ during which the voltage of the battery recovers; a subsequent period 74$d$ during which the starter cranks the engine of the vehicle; a subsequent period 74$e$ during which the engine of the vehicle is started (and the starter remains connected to the battery); and a subsequent period 74$f$ during which the engine is started (and the starter is disconnected from the battery).

During period 74$a$ (about time 0.0 seconds) the open circuit voltage of the battery is about 12.6 V. During period 704$b$ (about time 0.01 seconds) a relatively large drop from the voltage of the battery occurs (to about 9.0 V). This drop corresponds to the connection of the starter to the battery and a resulting initial high current draw by the starter. During period 74$c$ (about time 0.01 to 0.05 seconds) the voltage of the battery recovers to about 11.1 V.

Referring further to FIG. 5, the voltage of the battery "ripples" or oscillates during period 74$d$ (about time 0.05 to 1.2 seconds)—referred to as a "ripple interval." A minimum voltage value 76 during the ripple interval corresponds to the compression of gas by a piston of the engine. A maximum voltage value 78 during the ripple interval corresponds to the expansion of the gas in the engine. According to a particularly preferred embodiment, the ripple interval is defined by a period of 100 milliseconds to 480 milliseconds after the starter is connected to the battery. The difference between each minimum voltage value 76 and each maximum voltage value 78 during period 74$d$ may be averaged to provide an average amplitude of the voltage during the ripple interval.

Referring further to FIG. 5, the engine starts at the beginning of period 74$e$ (about time 1.2 to 1.4 seconds). Without intending to be limited to any particular theory, it is believed that the amplitude of the voltage during the ripple interval decreases relative to the amplitude of the voltage during period 74$e$ because the starter is no longer cranking the engine.

Referring further to FIG. 5, the starter is disconnected from the battery at the beginning of period 74$f$ (at about time 1.4 to 2.0 seconds). Without intending to be limited to any particular theory, it is believed that a relatively steep rise in voltage occurs during period 74$f$ due to disconnection of the starter from the battery and from charging of the battery by the alternator of the vehicle.

Figure 6:
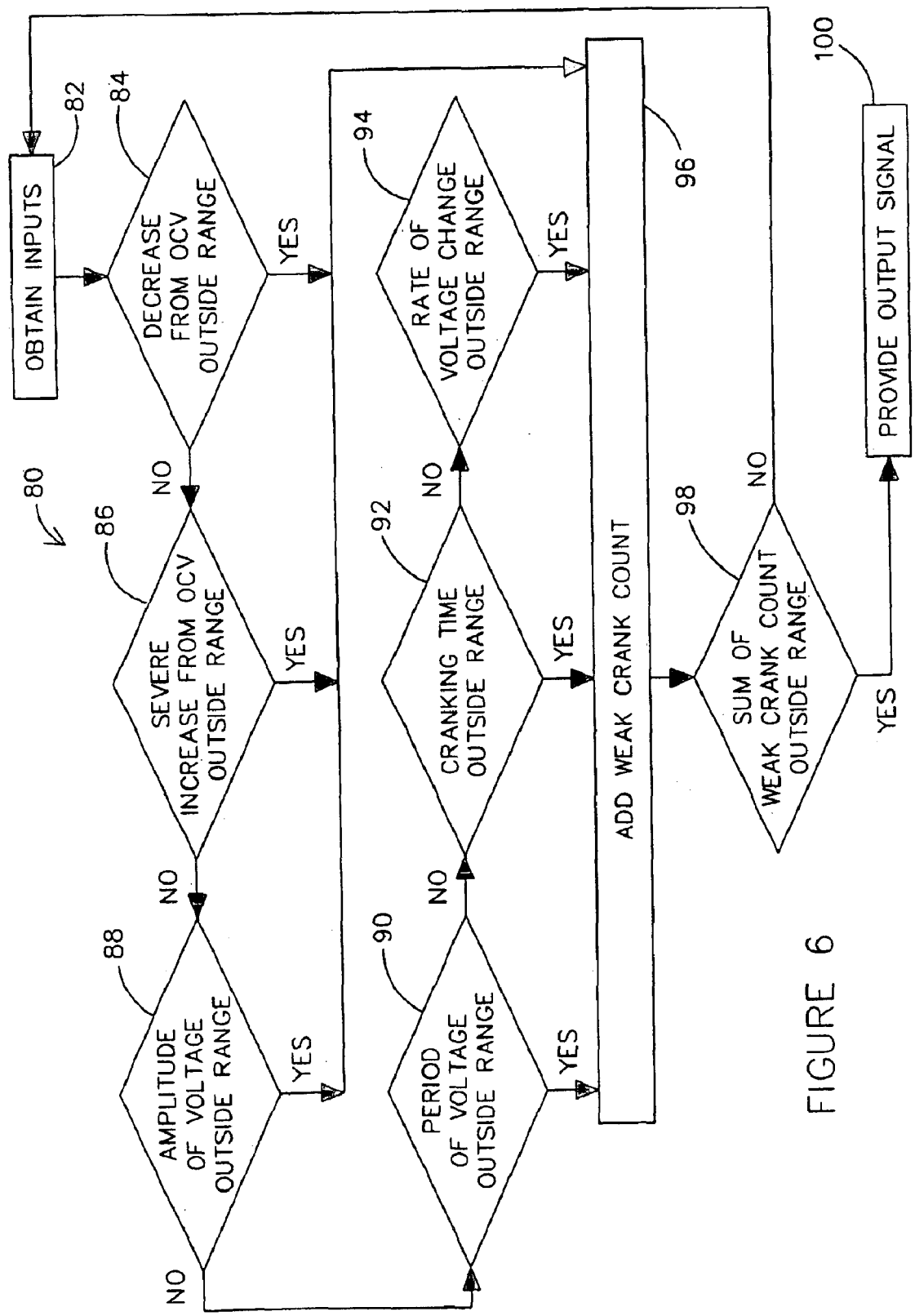
FIG. 6 is a flow diagram of a routine for predicting whether a battery may deliver a sufficient amount of power for a sufficient amount of time according to an alternative embodiment.

A routine 80 for predicting whether a battery may deliver a sufficient amount of power for a sufficient amount of time (based on a weak crank of the engine) is shown in FIG. 6 according to an alternative embodiment. Routine 80 uses an input signal obtained from sensors (or otherwise acquired) representative of the voltage of the battery (step 82) during at least one of periods 74$a$–74$f$ (see FIG. 5). The battery monitoring system makes a determination whether the monitored drop in voltage of the battery from open circuit voltage (period 74$a$ in FIG. 5) to the voltage during the ripple interval (period 74$d$ in FIG. 5) is within a range of pre-determined values (step 84). According to a preferred embodiment, the routine compares the average open circuit voltage to the average voltage during the ripple interval (over a pre-determined number of starts of the engine with reference to a new, fully charged battery) to determine an "average voltage drop." This average voltage drop is set as a range of pre-determined values according to a preferred embodiment, or some other range of pre-determined values (e.g. about 1.4 volts plus 20 percent, i.e. about 1.4 V to 1.7 V) according to an alternative embodiment. If the monitored drop in voltage of the battery from open circuit voltage to the voltage during the ripple interval is outside the range of pre-determined values, then a count is recorded representative of a weak crank of the engine (step 96). If the sum of the counts is not outside a range of pre-determined values (e.g. 9 counts in the last 12 attempts to start the engine) (step 98), then routine 80 continues to obtain inputs (step 82). If the sum of the counts is outside the range of pre-determined values (step 98), then an output signal is provided representative of a warning that the battery may not deliver a sufficient amount of power for a sufficient amount of time.

The monitored drop in voltage of the battery from open circuit voltage to the voltage of the ripple interval may be adjusted due to the temperature of the battery according to an alternative embodiment. Without intending to be limited to any particular theory, it is believed that the drop in voltage of the battery from open circuit voltage to the voltage of the ripple interval may increase as temperature decreases. The drop in voltage of the battery from open circuit voltage to the voltage of the ripple interval at various temperatures is shown in FIG. 7 according to an exemplary embodiment. As shown in FIG. 7, the drop in voltage of the battery at 40 degrees Celsius from open circuit voltage to the voltage of the ripple interval is about 1.4 V. A pre-determined range of drops in voltage of the battery from open circuit voltage to the voltage of the ripple interval may be set (e.g. about 1.4 V–1.7 V, i.e. about 20 percent greater than the average drop in voltage of the battery from open circuit voltage to the voltage of the ripple interval at that temperature) according to another alternative embodiment.

Referring further to FIG. 6, the battery monitoring system makes a determination whether the monitored open circuit voltage of the battery (period 74$a$ in FIG. 5) is within a range of pre-determined values (step 86). According to a preferred embodiment, the routine determines an average open circuit voltage over a pre-determined number of starts of the engine with reference to a new, fully charged battery (e.g. about 12.6 V plus or minus 20 percent, i.e. 10.1–15.1 V). If the monitored open circuit voltage of the battery is outside the range of pre-determined values, then a count is recorded representative of a weak crank of the engine (step 96). Without intending to be limited to any particular theory, it is believed that a severe increase from the open circuit voltage of the battery (e.g. from about 12.6 V–12.8 V to about 13.3 V–13.5 V) over time (e.g. days, months, etc.) may indicate that the battery is experiencing water and electrolyte loss. If the sum of the counts is not outside a range of pre-determined values (e.g. 9 counts in the last 12 attempts to start the vehicle) (step 98), then routine 80 continues to obtain inputs (step 82). If the sum of the counts is outside the range of pre-determined values (step 98), then an output signal is provided representative of a warning that the battery may not deliver a sufficient amount of power for a sufficient amount of time.

Referring further to FIG. 6, the battery monitoring system makes a determination whether the monitored amplitude of the voltage of the battery during the ripple interval (period 74$d$ in FIG. 5) is within a range of pre-determined values (step 88). According to a preferred embodiment, the routine determines an average amplitude of the voltage during the ripple interval over a pre-determined number of starts of the engine with reference to a new, fully charged battery (e.g. about 0.1 V plus or minus 20 percent, i.e. about 0.08 V to 1.02 V). If the monitored amplitude of the voltage of the battery during the ripple interval is outside the range of pre-determined values, then a count is recorded representative of a weak crank of the engine (step 96). If the sum of the counts is not outside a range of pre-determined values (e.g. 9 counts in the last 12 attempts to start the vehicle) (step 98), then routine 80 continues to obtain inputs (step 82). If the sum of the counts is outside the range of pre-determined values (step 98), then an output signal is provided representative of a warning that the battery may not deliver a sufficient amount of power for a sufficient amount of time.

Referring further to FIG. 6, the battery monitoring system makes a determination whether the monitored "period" of the voltage of the battery during the ripple interval (period 74*d* in FIG. 5) (i.e. the time interval between two successive occurrences of minimum voltage value 74 during the ripple interval) is within a range of pre-determined values (step 90). According to a preferred embodiment, the routine determines an average period of the voltage during the ripple interval over a pre-determined number of starts of the engine with reference to a new, fully charged battery (e.g. about 11.1 V plus or minus 20 percent, i.e. about 8.9 V to 13.3 V). Without intending to be limited to any particular theory, it is believed that an increase in the period of the voltage during the ripple interval may indicate there is relatively little life remaining in the battery (i.e. it takes a longer duration for the starter to crank the engine). If the monitored period of the voltage of the battery during the ripple interval is outside the range of pre-determined values, then a count is recorded representative of a weak crank of the engine (step 96). If the sum of the counts is not outside a range of pre-determined values (e.g. 9 counts in the last 12 attempts to start the vehicle) (step 98), then routine 80 continues to obtain inputs (step 82). If the sum of the counts is outside the range of pre-determined values (step 98), then an output signal is provided representative of a warning that the battery may not deliver a sufficient amount of power for a sufficient amount of time.

Referring further to FIG. 6, the battery monitoring system makes a determination whether the monitored cranking time required to start the engine (period 74*d* in FIG. 5) is within a range of pre-determined values (step 92). According to a preferred embodiment, the routine determines an average cranking time required to start the engine over a pre-determined number of starts of the engine with reference to a new, fully charged battery (e.g. less than about 1.2 seconds plus 20 percent, i.e. about 0 to 1.4 seconds). If the monitored cranking time required to start the engine is outside the range of pre-determined values, then a count is recorded representative of a weak crank of the engine (step 96). If the sum of the counts is not outside a range of pre-determined values (e.g. 9 counts in the last 12 attempts to start the vehicle) (step 98), then routine 80 continues to obtain inputs (step 82). If the sum of the counts is outside the range of pre-determined values (step 98), then an output signal is provided representative of a warning that the battery may not deliver a sufficient amount of power for a sufficient amount of time.

Referring further to FIG. 6, the battery monitoring system makes a determination whether the monitored rate of change of the voltage of the battery during the ripple interval (period 74*d* in FIG. 5) is within a range of pre-determined values (step 94). According to a preferred embodiment, the routine determines an average rate of change of the voltage of the battery during the ripple interval over a pre-determined number of starts of the engine with reference to a new, fully charged battery (e.g. a rate greater than about 0). If the rate of change of the voltage of the battery during the ripple interval is outside a range of pre-determined values, then a count is recorded representative of a weak crank of the engine (step 96). If the sum of the counts is not outside a range of pre-determined values (e.g. 9 counts in the last 12 attempts to start the vehicle) (step 98), then routine 80 continues to obtain inputs (step 82). If the sum of the counts is outside the range of pre-determined values (step 98), then an output signal is provided representative of a warning that the may not deliver a sufficient amount of power for a sufficient amount of time.

According to a particularly preferred embodiment, routine 80 is run after routine 50 makes a determination that there is relatively little life remaining in the battery (e.g. 10 percent life remaining, about 330 days of life remaining, more than 1000 life cycling counts used by the battery, etc.). The pre-determined values of routine 80 may be adjusted according to the amount of life remaining in the battery as determined by routine 50 according to an alternative embodiment.

The input signals (or combination of input signals) may be representative of conditions or states of the battery system such as voltage of the battery, current drawn by loads connected to the battery, resistance of the battery, temperature of the battery, time, etc. according to any preferred or alternative embodiments. The input signals may also relate to a characteristic of the battery (such as model number, purchase date, installation date, size, capacity, cold cranking capability rating, reserve capacity rating, etc.) according to any preferred or alternative embodiment. The range of the pre-determined values that are compared to the input signals by the battery management system may be preprogrammed or determined during operation, use, testing, etc. of the vehicle according to any preferred or alternative embodiments. The range of the pre-determined values may be adjusted or calibrated over time according to any preferred or alternative embodiments. The "other devices" for providing inputs to the battery management system may comprise an input device such as a keyboard, display (e.g. touch screen), etc. according to alternative embodiments. The other devices may include a "remote connection" to the battery management system such as a wireless device (e.g. HomeLink™ wireless control system, key fob, cellular or digital device, etc.) communicated by a variety of methods and protocols (e.g. infrared, radio frequency, Bluetooth, Wide Application Protocol, etc.) according to alternative embodiments. The "other devices" may comprise a magnetically coupled communication port such as a Manual Swipe Magnetic Card Low-Co Reader/Writer model no. RS-232 commercially available from Uniform Industrial Corp., Fremont, Calif., USA according to a particularly preferred embodiment.

The battery management system may comprise a computing device, microprocessor, controller or programmable logic controller (PLC) for implementing a control program, and which provides output signals based on input signals provided by a sensor or that are otherwise acquired. Any suitable computing device of any type may be included in the battery management system according to alternative embodiments. For example, computing devices of a type that may comprise a microprocessor, microcomputer or programmable digital processor, with associated software, operating systems and/or any other associated programs to implement the control program may be employed. The controller and its associated control program may be implemented in hardware, software or a combination thereof, or in a central program implemented in any of a variety of forms according to alternative embodiments. A single control system may regulate the controller for the battery management system and the controller for the vehicle according to an alternative embodiment.

It is important to note that the use of the term battery "management" or "battery management system" is not intended as a term of limitation insofar as any function relating to the battery, including monitoring, charging, discharging, recharging, conditioning, connecting, disconnecting, reconnecting, etc., is intended to be within the scope of the term.

It is important to note that the construction and arrangement of the elements of the battery monitoring system as shown in the preferred and other exemplary embodiments is illustrative only. Although only a few embodiments of the present invention have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, orientations, etc.) without materially departing from the novel teachings and advantages of the subject matter recited in the claims. For example, the battery management system may be installed directly on the battery or otherwise electrically connected to the battery according to alternative embodiments. Accordingly, all such modifications are intended to be included within the scope of the present invention as defined in the appended claims. The input signals may be representative of the current drawn from the battery according to an alternative embodiment. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the preferred and other exemplary embodiments without departing from the spirit of the present invention as expressed in the appended claims.

What is claimed is:

1. A method for predicting the remaining life of a battery for a vehicle comprising:
   obtaining a value representative of the amount of remaining life for a battery in a new and fully charged state;
   monitoring at least one parameter of the battery during use of the battery;
   obtaining an acceleration factor for the at least one monitored parameter; and
   estimating the amount of life lost from the battery utilizing the acceleration factor;
   whereby the estimation of the amount of life lost utilizes historical information relating to the use of the battery.

2. The method of claim 1 wherein the at least one parameter includes at least one of the voltage of the battery, the temperature of the battery, and the state of charge of the battery.

3. The method of claim 1 wherein the step of monitoring at least one parameter of the battery include s monitoring the voltage of the battery and the temperature of the battery.

4. The method of claim 3 wherein the step of estimating the amount of life lost from the battery comprises determining an amount of time that the battery has been at a particular voltage and temperature and applying the acceleration factor to the amount of time to provide an estimate of the amount of life lost during the amount of time.

5. The method of claim 4 wherein the step of applying the acceleration factor to the amount of time comprises multiplying the amount of time by the acceleration factor.

6. The method of claim 4 wherein the step of monitoring at least one parameter of the battery further comprises monitoring the state of charge of the battery.

7. The method of claim 1 wherein the step of monitoring at least one parameter of the battery comprises monitoring the state of charge of the battery.

8. The method of claim 7 wherein the step of estimating the amount of life lost from the battery comprises determining an amount of time that the battery has been at a particular state of charge and applying the acceleration factor to the amount of time to obtain an estimate of the amount of life lost.

9. The method of claim 8 wherein the step of applying the acceleration factor to the amount of time comprises dividing the amount of time by the acceleration factor.

10. The method of claim 1 further comprising subtracting the estimated amount of life lost from the battery from the value representative of the amount of remaining life for a battery in a new and fully charged state to obtain an adjusted value for the amount of remaining life for the battery.

11. The method of claim 1 wherein the step of monitoring at least one parameter comprises monitoring the voltage of the battery, the temperature of the battery, and the state of charge of the battery.

12. The method of claim 11 further comprising determining the amount of time that the battery has been at a particular voltage, temperature, and state of charge.

13. The method of claim 12 wherein the step of obtaining an acceleration factor comprises obtaining a first acceleration factor for the temperature and voltage and a second acceleration factor for the state of charge.

14. The method of claim 13 wherein the step of estimating the amount of life lost from the battery comprises applying the first acceleration factor and the second acceleration factor to the amount of time to obtain an estimated amount of life lost.

15. The method of claim 14 wherein the step of estimated amount of life lost from the battery comprises multiplying the amount of time by the first acceleration factor and dividing the amount of time by the second acceleration factor.

16. The method of claim 1 wherein the step of obtaining an acceleration factor utilizes a lookup table.

17. The method of claim 1 further comprising providing an output signal based on the estimated amount of life lost from the battery.

18. The method of claim 17 wherein the output signal is representative of an amount of life remaining in the battery.

19. The method of claim 17 wherein the output signal comprises a warning signal.

20. A method for monitoring a battery comprising:
    obtaining an estimate of the time that a new battery will deliver a sufficient amount of power for a vehicle application;
    monitoring the battery during use;
    determining the amount of time that the battery has been in a first state during the use;
    obtaining an acceleration factor for the first state;
    adjusting the amount of time that the battery has been in the first state utilizing the acceleration factor; and
    subtracting the adjusted amount of time from the estimate to obtain an estimate of the remaining time that the battery will deliver a sufficient amount of power for a vehicle application.

21. The method of claim 20 wherein the first state includes a first temperature of the battery and a first voltage of the battery.

22. The method of claim 21 wherein the step of adjusting the amount of time comprises multiplying the amount of time by the acceleration factor.

23. The method of claim 21 wherein the first state also includes a first state of charge of the battery.

24. The method of claim 23 wherein the step of obtaining an acceleration factor for the first state comprises obtaining a first acceleration factor for the first voltage and first temperature and obtaining a second acceleration factor for the first state of charge.

25. The method of claim 24 wherein the step of adjusting the amount of time comprises multiplying the amount of time by the first acceleration factor and dividing the amount of time by the second acceleration factor.

26. The method of claim 20 wherein the step of determining the amount of time that the battery has been in the first state comprises identifying a plurality of occurrences of the first state during use of the battery and summing the durations of time for each of these occurrences.

27. The method of claim 20 further comprising providing an output signal based on the estimate of the remaining time that the battery will deliver a sufficient amount of power.

28. The method of claim 20 wherein the step of obtaining an acceleration factor utilizes a lookup table.

29. The method of claim 20 further comprising:
determining the amount of time that the battery has been in a second state during the use;
obtaining an acceleration factor for the second state;
adjusting the amount of time that the battery has been in the second state utilizing the acceleration factor for the second state; and
subtracting the adjusted amount of time that the battery has been in the second state from the estimate.

30. A method for monitoring a battery for a vehicle comprising:
obtaining an input signal representative of an estimate of the amount of life remaining for a new battery;
obtaining input signals during use of the battery that are representative of states of the battery;
determining the amount of time the battery is at a first state;
determining the amount of time the battery is at a second state;
obtaining a first acceleration factor for the first state and a second acceleration factor for the second state;
applying the first acceleration factor to the amount of time the battery is at the first state to provide a first adjusted amount of time;
applying the second acceleration factor to the amount of time the battery is at the second state to provide a second adjusted amount of time; and
subtracting the first adjusted amount of time and the second adjusted amount of time from the estimate to provide an adjusted estimate of the remaining life of the battery.

31. The method of claim 30 wherein the first state and the second state include at least one of the voltage of the battery and the temperature of the battery.

32. The method of claim 30 wherein the first state includes a first temperature of the battery and a first voltage of the battery and the second state includes a second temperature of the battery and a second voltage of the battery.

33. The method of claim 32 wherein the step of applying the first acceleration factor comprises multiplying the first acceleration factor by the amount of time the battery is in the first state and the step of applying the second acceleration factor comprises multiplying the second acceleration factor by the amount of time the battery is in the second state.

34. The method of claim 33 wherein the first state also includes a first state of charge of the battery and the second state also includes a second state of charge of the battery.

35. The method of claim 34 wherein the step of obtaining a first acceleration factor for the first state comprises obtaining a first acceleration factor for the first voltage and first temperature and obtaining a third acceleration factor for the first state of charge.

36. The method of claim 35 further comprising applying the third acceleration factor to the amount of time the battery is at the first state.

37. The method of claim 30 further comprising providing an output signal based on the adjusted estimate.

38. The method of claim 30 wherein the step of obtaining a first acceleration factor for the first state and a second acceleration factor for the second state utilizes a lookup table.

* * * * *